United States Patent
König et al.

(10) Patent No.: US 6,521,349 B1
(45) Date of Patent: Feb. 18, 2003

(54) TOOL WITH A MOLYBDENUM SULFIDE COATING AND METHOD FOR PRODUCING THE SAME

(75) Inventors: Udo König, Essen (DE); Volkmar Sottke, Mülheim (DE); Albrecht Leonhardt, Dresden (DE); Ingolf Endler, Coswig (DE)

(73) Assignee: Widia GmbH, Essen (DE)

( * ) Notice: Subject to any disclaimer, the term of this patent is extended or adjusted under 35 U.S.C. 154(b) by 0 days.

(21) Appl. No.: 09/890,049

(22) PCT Filed: Nov. 30, 1999

(86) PCT No.: PCT/DE99/03781

§ 371 (c)(1),
(2), (4) Date: Jul. 25, 2001

(87) PCT Pub. No.: WO00/52222

PCT Pub. Date: Sep. 8, 2000

(30) Foreign Application Priority Data

Mar. 3, 1999 (DE) .......................................... 199 09 372

(51) Int. Cl.⁷ .......................... B32B 15/04; C23C 16/00
(52) U.S. Cl. ........................ 428/469; 428/336; 428/472; 428/216; 428/255; 427/248.1; 407/119
(58) Field of Search ............................ 407/119; 51/309, 51/307, 295; 428/336, 469, 472, 216, 255; 427/248.1

(56) References Cited

U.S. PATENT DOCUMENTS

| 2,671,739 A | | 3/1954 | Lander et al. |
| 5,709,936 A | | 1/1998 | Besmann et al. |
| 5,843,533 A | | 12/1998 | Besmann et al. |
| 6,284,366 B1 | * | 9/2001 | Konig et al. ................. 428/336 |

* cited by examiner

Primary Examiner—Deborah Jones
Assistant Examiner—G. A. Blackwell-Rudasill
(74) Attorney, Agent, or Firm—Herbert Dubno

(57) ABSTRACT

The invention relates to a tool, especially a cutting insert for cutting metallic materials, consisting of a hard metal, cermet, ceramic or steel base body and at least one coating deposited thereon. This single coating or in the event that there are several layers, the outer layer or the layer below the outer layer, consists essentially of molybdenum sulphide. The invention also relates to a method for producing the molybdenum sulphide coating by chemical vapour deposition. According to the invention, the molybdenum sulphide coating contains a mixture of the sulphide phases $MoS_2$ and $Mo_2S_3$ with an essentially random orientation (isotropic orientation) of the phase crystals. The coating is applied by means of a chemical vapour deposition procedure.

15 Claims, No Drawings

TOOL WITH A MOLYBDENUM SULFIDE COATING AND METHOD FOR PRODUCING THE SAME

CROSS REFERENCE TO RELATED APPLICATIONS

This application is a national stage of PCT/DE99/03781 filed Nov. 30, 1999 and based upon German national application 199 09 372.5 of Mar. 3, 1999 under the International Convention.

FIELD OF THE INVENTION

The invention relates to a tool, especially a cutting insert, for the machining of metallic workpieces, composed of a hard metal base body, a cermet base body, a ceramic base body or a steel base body and at least one layer deposited thereon, in which the sole layer or in the case of a plurality of layers, the outermost layer or the layer lying beneath the outermost layer is constituted predominantly of molybdenum sulfide.

The invention also relates to a method of producing the molybdenum sulfide layer by means of CVD (chemical vapor deposition).

BACKGROUND OF THE INVENTION

The coating of substrate bodies of hard metal, a cermet, a ceramic, or steel with hard materials or hard material mixtures or ceramic materials is known from the state of the art. Especially, carbides, nitrides, carbonitrides, oxycarbonitrides and/or borides of at least one of the elements of groups IVa to VIa of the Periodic Table are used, such as, for example, TiC, TiN, Ti(C,N) or also ceramic materials like $Al_2O_3$ or $ZrO_2$. With large cutting speeds and/or large chip cross sections, high temperatures arise at the cutting edge of the machining tool especially in the case of materials which are difficult to machine, thereby giving rise to increased wear which can lead in part also to edge breakage. To minimize the temperatures which arise at the cutting edge of the tool during machining, usually so-called cooling lubricants have been used which contain either toxic and environmentally polluting substances and which must be disposed of at relatively high cost.

A further possibility, which can reduce the use of coolant lubricants drastically, is the principle of so-called minimum quantity lubrication, whereby very small amounts of coolant lubricants are supplied with point precision through fine passages to the location between the tool cutter and the workpiece. Apart from a high cost for carrying out the method and for the apparatus involved, this approach does not eliminate the waste treatment problem but only minimizes it.

On the other hand, there are so-called solid dry lubricant films, for example, molybdenum disulfide, known in the art. For example DE-A- 24 15 255 proposes to improve the adhesion of a layer which is preferably based upon $MoS_2$ or $WS_2$ and which is applied by so-called sputtering with a thickness of 1 to 2 μm and in which the application of a dry lubricant layer based also upon $MoS_2$ or $WS_2$ can be effected in a conventional manner by a polishing application. In the East German patent document (DD) 202 898 it has been proposed to apply layers or the like of molybdenum disulfide by sputtering to cutting tools, stamping tools, drawing tools and machining tools, whereby the layer thickness lies in the nm range. The layer which is applied by sputtering to a substrate body provided with a hard material layer should have a hexagonal lattice structure. EP 0 534 905 A2 also proposes the PVD (plasma vapor deposition) coating of machining tools, inter alia with molybdenum disulfide.

It has, however, been found that $MoS_2$ layers produced by cathodic atomization (sputtering) adhere poorly to the substrate body or to the outer hard material layer applied to the substrate body or have a predominantly unsatisfactory orientation of the $MoS_2$ crystallites. To obtain the lowest friction coefficients, the hexagonal components of the $MoS_2$ layer should be so oriented that the hexagonal base planes lie parallel to the surface. Thereby the oxidation resistance of the layer is also improved.

It is thus proposed in DE 35 16 933 A1 that the ratio of the water vapor partial pressure to the coating rate be adjusted to be smaller than $10^{-7}$ mbar/1.6 mgm$^{-2}$s$^{-1}$ which, in practice, can only be achieved with considerable technological cost.

Apart from the requirement which is customary for the PVD process for purity, i.e. that the gas atmosphere not contain foreign substances, there is a further drawback with the PVD process in that a directed particle stream is provided from the target source to the substrate whereby the substrate must be rotated about three axes to produce a uniform coating.

Furthermore WO 97/04142 describes a process for uniform coating of $MoS_2$ and a metal or a metal compound like titanium or titanium nitride through the use of two targets by means of a sputtering process.

While MoS2 is relatively soft and is not especially wear-resistant, the formation of an $MoS_2$ coating has a significant effect since by the use of a single $MoS_2$ layer or an outermost MoS$^2$ layer at the contact location of the tool with the workpiece, the $MoS_2$ may be quickly abraded but the friction force because of the penetration of the $MoS_2$ particles from the edge inwardly (entrainment) is still noticeably reduced for a period of time.

OBJECTS OF THE INVENTION

It is the object of the present invention to provide a single layer or an outermost layer or layer combination which has a dense lattice structure and a higher hardness of greater mechanical stability against wear. It is also an object to provide a method of producing such a layer.

DESCRIPTION OF THE INVENTION

These objects are achieved by a tool in which the molybdenum sulfide layer contains a mixture of the sulfide phases $MoS_2$ and $MoS_2S_3$ with a substantially random orientation of the phase crystals. The layered lattice structure is comprised of randomly oriented $MoS_2$ grains which partly have a platelet-shaped configuration. The intervening spaces are filled with the $Mo_2S_3$ phase. With these features a surprisingly improved wear resistance of the layer is achieved on machining.

Thus still further phases of molybdenum sulfur compounds and/or chlorine can be contained in the molybdenum sulfide layer but should not exceed 6 atomic %.

A single molybdenum sulfide layer or the outermost molybdenum sulfide layer can also be fabricated so as to be of a multilayer type, whereby the respective undermost layer or an underlying layer with a thickness respectively not exceeding 200 nm has a hexagonal lattice structure with a preferred orientation of the hexagonal planes parallel to the tool surface. The remaining layers however are of isotropic orientation. This applies especially for a substrate body which is coated with only a single molybdenum sulfide layer (and no other layer). The layer with the hexagonal $MoS_2$ crystals is thereby bounded directly by the substrate and has a thickness of 100 nm to 200 nm.

According to a further feature of the invention, the $Mo_2S_3$ component in the molybdenum layer does not remain continuously homogeneous but with increasing distance from the substrate body surface is present in different proportions, preferably varying periodically from 5 to 30 volume %.

According to a further feature of the invention, the molybdenum sulfide layer contains successive individual layers of different compositions of which one type comprises the mixture of $MoS_2$ and $Mo_2S_3$ sulfide phases and the other type consists substantially of pure $MoS_2$. Each of the $MoS_2$ layers has a maximum thickness of 200 nm. The thicknesses of layers of the mentioned phase mixture ($MoS_2$/$Mo_2S_3$) respectively lie between 200 nm and 400 nm.

In a further embodiment of the tool of the invention there are still further metallic phases and/or hard material phases in the molybdenum sulfide layer under consideration and whose volume proportion however is preferably not in excess of 10 volume %. The metals in question can be especially molybdenum and the materials especially molybdenum carbide, titanium carbonitride or chromium carbide. Such metal phases or hard material phases serve to increase the stability of this layer which however is in substance the molybdenum sulfide of the mixture described at the outset. The volume proportion of $MoS_2$ in this layer lies between 30 and 98 volume %, preferably between 40 to 95 volume %. The layer thickness lies between 0.5 to 8 $\mu$m, preferably between 2 and 4 $\mu$m.

Optionally the single or outermost layer of molybdenum sulfide can have still a further metallic layer of a thickness $\leq 200$ nm applied thereto. Preferably metals of groups IVa to VIa of the Periodic Table are used. Alternatively these thin outer layers of a maximum of 200 nm in thickness can also be composed of a hard material, preferably a carbide, a nitride or a carbonitride of one of the aforementioned elements.

The molybdenum sulfide layer is applied by means of a CVD process, preferably using the subsequently described process technique.

For producing the mentioned coating, a CVD process is used in which the gas mixture is composed of molybdenum chloride, hydrogen sulfide, a noble gas and hydrogen and with a coating temperature lying between 500° C. and 900° C., preferably between 600° C. and 850° C. The pressure amounts to 0.1 to 50 kPa, preferably between 0.1 and 1 kPa. The molar ratio between hydrogen sulfide and molybdenum chloride lies between 0.1 and 4, preferably between 0.1 and 2. The proportion of hydrogen and argon together makes up between 80 to 99 volume %, preferably between 90 to 98 volume %.

Preferably $MoCl_5$ is used although optionally $MoCl_4$ or mixtures of $MoCl_5$ and $MoCl_4$ can be used.

The maintenance of the above-mentioned parameters is significant for the production of the layer consisting essentially of molybdenum sulfide. With greater than the afore-described molar ratios, layers are obtained which consist exclusively or predominantly of hexagonal $MoS_2$. $MoCl_5$ can decompose at temperatures above 200° into $MoCl_4$ and Cl so that the molybdenum sulfide can be formed both from $MoCl_5$ and also from $MoCl_4$.

The mixed layer, which contains hexagonal $MoS_2$ and $Mo_2S_3$ can on the one hand be produced as a coating with a constant $Mo_2S_3$ proportion and random orientation of the $MoS_2$ crystallites. On the other hand the method of the invention can also produce multilayer coatings which can have alternating layers of $MoS_2$/$Mo_2S_3$ phase mixtures and layers of oriented $MoS_2$. In the last-mentioned case, the $MoS_2$ layers however should not be thicker than 200 nm since otherwise pores will develop in the molybdenum sulfide layer whereby the density thereof will diminish. In a special embodiment, the molar ratio $H_2S$/$MoCl_5$ during the coating alternates for equally long time periods in which one of the selected mole ratios is greater than the other by a factor of 7 to 10 so that with a greater mole ratio, pure $MoS_2$ is deposited and with the smaller mole ratio, a phase mixture of MoS2 and $Mo_2S_3$ is deposited. The duration over which the substantially pure $MoS_2$ is deposited is that which will provide a maximum permissible layer thickness of 200 nm. By comparison, the duration in which the mole ratio is set to deposit the phase mixture $MoS_2$/$Mo_2S_3$ can be two or three times as great. Preferably 8 to 12 layers are deposited of which substantially half are composed of the mentioned phase mixture and the other half are of $MoS_2$.

Alternatively here too, the molar.ratio $H_2S$/$MoCl_5$ can be so controlled that during deposition the $Mo_2S_3$ phase proportion periodically varies.

The molybdenum sulfide layer is composed in essence of hexagonal $MoS_2$ and $Mo_2S_3$ although it can however contain still further phases which can be formed from the gas mixture of $MoCl_5$, $H_2S$, $H_2$ and argon. In this manner, small proportions of rhombo-hedral $MoS_2$, $MoS_2Cl_2$ and $MoCl_3$ can arise which, however, have no noticeable effect on the layer characteristics.

The layer consisting essentially of molybdenum sulfide can also be formed in a multilayer manner whereby the individual layers containing essentially $MoS_2$ and $Mo_2S_3$ can be separated by intermediate layers of a metal or a metallic hard material. The intermediate layers are however always thinner than 0.3 $\mu$m. As materials for such intermediate layers, molybdenum or molybdenum carbide are to be considered, these enhancing mechanical stability of the molybdenum sulfide layer according to the invention. To deposit molybdenum or molybdenum carbide, the gas mixture composition in the CVD process is so altered that the feed of $H_2S$ is interrupted and replaced by $CH_4$. By rapid switching of the gas it is possible to obtain quasicontinuous layers which aside from $MoS_2$ and $Mo_2S_3$ also contain other phases. With this feature, the stability of the dry lubricant layer can also be improved. In practice one balances which components of the stability enhancing nonsulphidic impurities are present or intermediate layers are used. The lowest friction coefficients are obtained with layers which are comprised of hexagonal $MoS_2$ but can have the stability by the additional $Mo_2S_3$ phase and further by nonsulphidic impurities. The choice of the respective proportions of stabilizing-enhancing compounds and/or metals of hard materials depends upon the kind of workpiece material to be machined and the cutting forces arising during machining. The invention is described in further detail using concrete examples:

SPECIFIC EXAMPLES

Exemplary Embodiment 1

A CVD apparatus with a heatable quartz glass tube is used as the reaction chamber. The $MoCl_5$ gas is generated by evaporation of $MoCl_5$ salt at 110° C. in an argon flow and fed to the reaction chamber heated to 650° C. In a second test, the other gases are fed. The gas mixture is comprised of 0.4 volume % $H_2S$, 2.2 volume % $MoCl_5$, 14.6 volume % $H_2$ and 82.8 volume % Ar. The molar ratio $H_2S/MoCl_5$ amounts to 0.18. During the coating a pressure of 500 Pa is maintained in the reaction chamber. In the chamber, there are to be found uncoated lathe cutting insert plates and cutting insert plates coated with titanium nitride/titanium carbonitride/titanium nitride and thin silicon disks for analytic tests. After the coating duration of 150 minutes, layers of about 3 to 4 μm thickness are formed with a very dense lattice structure. By phase analysis by means of X-ray diffraction and electron diffraction, hexagonal $MoS_2$ and $MO_2S_3$ are found. The ratio in terms of quantity of the two phases can be regarded based upon the visibility of the two phases and is relatively coarsely defined. The volume proportion of the hexagonal $MoS_2$ phase amounted in the present case to about 60%. The relatively thick layer is adhesive and scratch resistant. The Vickers hardness amounted to 400 $HVO_2$. In tribological tests a coefficient of friction of 0.11 was found (against a steel ball).

Exemplary Embodiment 2

In another test with the above-described apparatus, two gas mixtures are used alternately in which the molar ratio $H_2S/MoCl_5$ is varied by a factor of 10. At the beginning of the test, a gas mixture of 0.2 volume % $H_2S$, 0.9 volume % $MoCl_5$, 14.8 volume % $H_2$ and 84.1 volume % Ar is supplied. The deposition temperature is 670° C. and the pressure 500 Pa. Under these conditions, a phase m mixture of hexagonal $MoS_2$ and $MO_2S_3$ is deposited. After 5 minutes, the $H_2S$ gas flow is increased by about ten-fold while all other gases are held constant. The new gas mixture of 1.8 volume % $H_2S$, 0.9 volume % $MoCl_5$, 14.6 volume % $H_2$ and 82.7 volume % Ar is fed to the reactor for a duration of two minutes. Under these conditions essentially pure $MoS_2$ is deposited. The alternation between both gas mixtures is effected 10 times. With the switchover times, the total coating interval was about 80 minutes. A dense layer with a thickness of 3.2 μm was obtained. In an X-ray diffractogram it can be seen that the intensity of the (0.02) reflection of the hexagonal $MoS_2$ is significantly greater than in the first embodiment. This means that more of the hexagonal $MoS_2$ is significantly greater than in the first embodiment. This means that more of the hexagonal $MoS_2$ oriented parallel to the surface normal is present. The bases for observation are the textures of the single phase $MoS_2$ layers. The Vickers hardness of the layer amounted to 380 $HVO2$ and the friction coefficient to 0.08.

Exemplary Embodiment 3

A temperature of 800° C. and a pressure of 500 Pa is established and the gas mixture of 0.4 volume % $H_2S$, 2.2 volume % $MoCl_5$, 54.2 volume % $H_2$ and 43.2 volume % Ar is supplied. After five minutes the $H_2S$ is shut off and all remaining parameters are not changed. From the $MoCl_5$, $H_2$ and Ar a thin layer of molybdenum metal is formed over five minutes. After 110 minutes, an about 4 μm thick layer with the phases $MoS_2$ and $Mo_2S_3$ is formed which has an enhanced molybdenum content and a dens lattice structure. The hardness value of the layer amounted to 520 $HVO_2$ and the friction coefficient to 0.14.

Exemplary Embodiment 4

Tests were carried out in Example 3 but with methane in the second step instead of $H_2S$: 6.9 volume % $CH_4$, 1.8 volume % $MoCl_5$, 55.3 volume % $H_2$ and 36 volume % Ar. This variant gave rise to the formation of thin intermediate layers of $Mo_2C$. The hardness value of the layer amounted to 530 KVO2 and the friction coefficient to 0.18.

The dry lubricant layers were tested using commercial lathe cutting plates of the form CNMG120412 which were constituted of a hard metal alloy of 6% Co, 8% (Ti,Ta,NB)C and 86% WC. The plates were provided with about 12 μm thick coating of the three layers TiN, Ti(C,N) and TiN which were applied in a CVD production apparatus at about 1000° C. Such plates were additionally provided with coatings according to the invention in the above-described test apparatus. In these examples layers with approximately the same thickness (3 μm) of the outermost $MoS_2/Mo_2S_3$ were used as outermost layers. With these coating plates, a shaft of stainless steel was turned in smooth sections until the cutting corner became unusable because of wear or breakage. The turning tests utilized dry cutting with cutting speeds of 200 m/min, cutting depths of 2.5 mm and a feed of 0.25 mm per revolution. The following results were obtained:

Cutting body CNMG120412,
Coated with TiN/Ti (C,N)TiN

| Embodiment | Thickness of the $MOS_2/Mo_2S_3$- Containing Layer | Life (Minutes) |
|---|---|---|
| Without an outer layer according to the invention | 0 μm | 9 |
| Dry lubricant layer according to Exemplary Embodiment 1 | 3.0 μm | 17 |
| Dry lubricant layer according to Exemplary Embodiment 2 | 3.2 μm | 19 |
| Dry lubricant layer according to Exemplary Embodiment 3 | 3.2 μm | 16 |
| Dry lubricant layer according to Exemplary Embodiment 3 | 2.9 μm | 15 |

These results show that all variants of the coating of the invention increase the use time in dry machining.

What is claimed is:

1. A method of producing a molybdenum sulfide coating on a cutting insert for machining metal, comprising the steps of:

(a) depositing on a cutting insert body of a material selected from the group which consists of hard metal, cermet, ceramic and steel as a sole layer or as the outermost layer or a layer underlying the outermost layer of a multiple layer coating a molybdenum sulfide layer containing a mixture of the sulfide phases $MoS_2$ and $Mo_2S_3$ by chemical vapor deposition from a gas mixture of molybdenum chloride, hydrogen sulfide, a noble gas and hydrogen;

(b) maintaining a temperature during the chemical vapor deposition of 500° C. to 900° C. during the chemical vapor deposition;

(c) maintaining a pressure between 0.1 kPa and 50 kPa during the chemical vapor deposition;

(d) maintaining a molar ratio of hydrogen sulfide/ molybdenum chloride between 0.1 and 4 during the chemical vapor deposition;

(e) maintaining a total of the hydrogen and noble gas content between 80 and 99 volume percent during the chemical vapor deposition; and (f) varying the molar ratio of hydrogen sulfide/ molybdenum chloride alternately for respective time intervals from a low molar ratio to a high molar ratio at 7 to 10 times the low molar ratio so that with the high molar ratio pure $MoS_2$ is deposited and at the low molar ratio a phase mixture of $MoS_2$ and $Mo_2S_3$ is deposited.

2. A The method according to claim 1 herein the duration over which the molar ratio is set so that essentially the phase mixture $MoS_2/Mo_2S_3$ is deposited is two to three times as great as the duration in which the essentially pure $MoS_2$ is deposited.

3. The method according to claim 1 wherein 8 to 12 layers are deposited.

4. The method according to claim 1 wherein said temperature is controlled to be 600 to 850° C., said pressure is set to be 0.1 to 1 kPa, said molar ratio lies between 0.1 and 2, and the total of the hydrogen and noble gas content is set to be between 90 and 98 volume percent.

5. A tool for machining of metal workpieces, comprised of a base body of a material selected from the group which consists of hard metals, cermets, ceramics and steel and wherein a sole layer or in a case of multiple layers the outermost layer or a layer lying under the outermost layer is composed essentially of molybdenum sulfide, the molybdenum sulfide layer containing a mixture of the sulfide phases $MoS_2$ and $MO_2S_3$ with an essentially random and isotropic orientation of the phase crystals.

6. The tool according to claim 5 wherein the molybdenum sulfide layer contains other molybdenum-containing, sulphur-containing or chlorine-containing phases.

7. The tool according to claim 5 wherein the sole molybdenum sulfide layer or the outermost molybdenum sulfide layer is multilayered and a respective lowermost layer or lowermost layers with respective thicknesses not exceeding 200 nm have a hexagonal lattice structure with a preferred orientation of the hexagonal planes parallel to the tool surface.

8. The tool according to claim 5 wherein the $Mo_2S_3$ content from the interior outwardly with increasing distance from the substrate body surface, varies periodically by 5 to 30 volume %.

9. The tool according to claim 7 wherein the successive layers of the molybdenum sulfide layer consist of essentially pure $MoS_2$ and of a phase mixture of essentially hexagonal $MoS_2$ and $Mo_2S_3$, whereby each of the individual $MoS_2$ layers has a maximum thickness of 200 nm and 400 nm.

10. The tool according to claim 9 wherein the single layer or the outermost or next to the outermost layer which essentially comprises molybdenum sulfide, contain still further metallic phases with a volume proportion of $\leqq 20\%$ in the form of molybdenum or hard material phases.

11. The tool according to claim 10 wherein said volume proportion is $\leqq 10\%$ and said further metallic phases are selected from the group which consists of molybdenum carbide, titanium carbide and chromium carbide.

12. The tool according to claim 5 wherein the volume proportion of $MoS_2$ in the molybdenum sulfide-containing layer is between 30 and 98 volume %.

13. The tool according to claim 12 wherein the volume proportion of $MoS_2$ is 40 to 95 volume percent.

14. The tool according to claim 5 wherein the thickness of the essentially molybdenum sulfide-containing layer is 2 to 4 µm.

15. The tool according to claim 5 wherein the outermost layer has a thickness $\leqq 200$ nm and is composed of a metal selected from an element of Groups IVa to VIa of the Periodic Table and a carbide, nitride and carbonitride of an element of Group IVa to VIa of the Periodic Table.

* * * * *